United States Patent
Tosaki et al.

(10) Patent No.: US 6,272,020 B1
(45) Date of Patent: *Aug. 7, 2001

(54) STRUCTURE FOR MOUNTING A SEMICONDUCTOR DEVICE AND A CAPACITOR DEVICE ON A SUBSTRATE

(75) Inventors: Hiromi Tosaki; Takaji Takenaka, both of Hadano; Kazutoshi Takahashi, Atsugi; Norio Sengoku; Toshitada Netsu, both of Hadano, all of (JP)

(73) Assignee: Hitachi, Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/173,174

(22) Filed: Oct. 15, 1998

(30) Foreign Application Priority Data

Oct. 16, 1997 (JP) .................................................. 9-299478

(51) Int. Cl.[7] ................................................ H05K 1/16
(52) U.S. Cl. ...................... 361/763; 361/761; 361/803; 174/261; 257/723
(58) Field of Search ................................ 361/760, 761, 361/763, 766, 767, 772, 784, 803, 807; 257/700, 698, 678, 723; 174/261, 250

(56) References Cited

U.S. PATENT DOCUMENTS

| 4,654,694 | * | 3/1987 | Val ..................................... 361/763 X |
| 5,309,324 | * | 5/1994 | Herandez et al. ................... 361/734 |
| 5,608,261 | * | 3/1997 | Bhattacharyya et al. ............ 257/700 |
| 5,636,099 | * | 6/1997 | Sugawaea et al. ................ 361/763 X |
| 5,877,550 | * | 3/1999 | Suzuki ................................. 257/700 |
| 5,973,928 | * | 10/1999 | Blasi et al. ............................ 361/760 |

FOREIGN PATENT DOCUMENTS

| 2-15699 | 1/1990 | (JP) . |
| 5-335364 | 12/1993 | (JP) . |
| 6-326472 | 11/1994 | (JP) . |

* cited by examiner

*Primary Examiner*—Jayprakash N. Gandhi
(74) *Attorney, Agent, or Firm*—Mattingly, Stanger & Malur, P.C.

(57) ABSTRACT

A semiconductor device-mounting substrate is provided with a semiconductor device, a capacitor device, and a wiring substrate. The wiring substrate has a space in which the capacitor device should be located, and the capacitor device is locate in the space. Terminals of a driving power supply wiring for the semiconductor device are provided on a surface of the space, and the terminals are connected with the capacitor device.

2 Claims, 4 Drawing Sheets

STRUCTURE FOR MOUNTING A
SEMICONDUCTOR DEVICE AND A
CAPACITOR DEVICE ON A SUBSTRATE

BACKGROUND OF THE INVENTION

The present invention relates to a semiconductor device-mounting substrate that comprises a semiconductor device and a substrate on which the semiconductor device is mounted and which is equipped with a capacitor device.

Concerning a large scale integrated circuit semiconductor device (LSI) in a C-MOS circuit, the current variation as a device is magnified since a large number of circuits are switched on/off simultaneously. Moreover, speeding-up of a signal transmission increases a variation in the transient power supply voltage, thus greatly decreasing an operation margin in the circuit.

With an increase in the circuit integration in recent years and an outstanding development in the speeding-up of the signal transmission in the circuit, there turns out to be less noise margin in the circuit operation. This decrease in the noise margin is now becoming a level at which a malfunction is quite likely to occur.

Accordingly, in order to prevent the malfunction, a capacitor device, which has a capacity ranging from about hundreds of nF to tens of $\mu$F, is provided in proximity to a LSI. The capacitor device is then connected with a power supply wiring for driving the LSI, thereby causing the above-described noise to be absorbed so as to prevent the malfunction.

For example, on a substrate such as a central processing circuit substrate in a large-sized electronic computer, a power supply wiring for driving a LSI chip is connected with the above-described capacitor device in the following way: First, tens of LSI chips or tens of package substrates mounting a LSI chip thereon are provided on a multilayer wiring circuit substrate. Then, in order to connect the driving power supply wiring for each of the LSI chips with the capacitor device, the wiring is extracted onto the outside of the region on which the LSI chips or the package substrates mounting a LSI chip thereon are mounted, and a large number of capacitor devices and LSI chips are mounted on the multilayer wiring circuit substrate, thus connecting the driving power supply wiring with the capacitor device.

FIG. 7 shows an example of a prior art multilayer wiring circuit substrate which mounts a large number of package substrates mounting a LSI chip thereon, and a large number of capacitor devices.

A large number of LSI chip-mounting substrates 10, one of which comprises a LSI chip 2 and a wiring substrate 3 mounting it thereon, are mounted on the surface of a circuit substrate 9 such as a ceramic substrate or a printed circuit substrate of a multilayer wiring structure. Also, a large number of capacitor devices 4 are connected onto the periphery of a region on which the LSI chip-mounting substrates are mounted.

Moreover, input/output pins 11, which are designed for connecting the circuit substrate 9 with a large-sized circuit substrate (not illustrated) mounting a plurality of circuit substrates 9 thereon further, are connected with the reverse side of the circuit substrate.

A driving power supply voltage for the semiconductor devices extends from the large-sized circuit substrate (not illustrated), through the input/output pins 11 and a wiring (not illustrated) inside the circuit substrate 9 of a multilayer structure, to the capacitor devices 4 and also to a power supply-driving terminal for the LSI chip 2.

FIG. 8 shows an example of the prior art LSI chip-mounting substrate (package substrate) 10.

The LSI chip-mounting substrate comprises the LSI chip 2 and the wiring substrate 3 for connecting it. The LSI chip is connected onto the surface of the wiring substrate.

As a carrier of the LSI chip, the wiring substrate 3 is installed for ensuring conveniences in the care and handling of the LSI chip and an electrical inspection thereof.

Incidentally, although not illustrated here, there is, in some cases, provided a cap for hermetically sealing the LSI chip in a margin over the surface periphery of the wiring substrate 3.

SUMMARY OF THE INVENTION

It is an object of the present invention to embody a high integration and the downsizing of a circuit substrate of a multilayer wiring structure, on which the capacitor devices are provided inside a region on which the large scale integrated circuit semiconductor devices are mounted.

It is another object of the present invention to enhance a noise-absorbing effect based on a connection with the capacitor device.

It is still another object of the present invention to cause a high frequency signal of a semiconductor device to be transmitted at high speed.

It is an even further object of the present invention to modify the circuit substrate, on which the semiconductor device-mounting substrates are provided, into a substrate which can be satisfactory as a circuit substrate for high frequency.

In the circuit substrate of a multilayer wiring structure on which, as described earlier, the large number of capacitor devices are provided outside the region on which the LSI chips are mounted, there exists a limit to a high integration of the circuit substrate or to the downsizing thereof.

Moreover, in a circuit substrate with which a high frequency band exceeding hundreds of MHz is employed and on which large-sized LSIs of 10 mm square or more are mounted, a wiring distance from a LSI to a connecting terminal of the capacitor device comes to exert a strong influence as an inductor component. This situation results in a defect that a noise-absorbing effect, which is based on the connection with the capacitor device, can not be obtained.

Meanwhile, regarding a high frequency signal of a semiconductor device, in order to cause the signal to be transmitted at high speed, it is necessary to form the signal wiring in a low dielectric material and to transmit the signal through the low dielectric material.

Concerning the prior art LSI chip-mounting substrates, however, it is not considered to simultaneously solve the above-described defect and problems. This brings about a fact that the circuit substrate, on which the semiconductor device-mounting substrates and the capacitor devices are provided, is not necessarily satisfactory as a circuit substrate for high frequency.

In order to attain the above-mentioned objects of the present invention, the present invention provides a semiconductor device-mounting substrate that comprises a semiconductor device and a wiring substrate on which the semiconductor device is mounted and which connects a capacitor device with a driving power supply wiring for the semiconductor device.

A constitution thereof is as follows: The wiring substrate has a space for providing the capacitor device, a terminal of the driving power supply wiring for the semiconductor device on the wiring substrate is provided on the surface of the space, the capacitor device is provided in the space, and thus the terminal is connected with the capacitor device.

Also, another constitution thereof is as follows: A second terminal, with which the other end of the capacitor device is connected, is provided on the surface of the above-described space. In addition, terminals of the wiring substrate in the semiconductor device-mounting substrate, which are on the side of a circuit substrate with which the semiconductor device-mounting substrate is connected, are provided in such a manner that the terminals are divided into a terminal group wired/connected to a wiring from the above-described second terminal of the wiring substrate and a terminal group wired/connected to a signal wiring of the semiconductor device on the wiring substrate.

Also, still another constitution thereof is as follows: Terminals of the wiring substrate in the semiconductor device-mounting substrate, which are on the side of a circuit substrate with which the semiconductor device-mounting substrate is connected, are provided in such a manner that the terminals are divided into a terminal group wired/connected to the other end of the capacitor device and a terminal group wired/connected to a signal wiring of the semiconductor device on the wiring substrate.

Also, a further constitution thereof is as follows: Terminals of the semiconductor device are located in such a manner that the terminals are divided into a terminal group of the driving power supply wiring for the semiconductor device and a terminal group of a signal wiring of the semiconductor device. Moreover, the terminal group of the signal wiring of the semiconductor device is connected with the wiring substrate in which the space for providing the capacitor device is formed, the capacitor device is provided in the space, one terminal of the capacitor device is connected with a terminal group of a driving power supply for the semiconductor device, and the terminal group of the signal wiring is connected with the wiring substrate in which the wiring is formed.

Also, an even further constitution thereof is as follows: Terminals of the semiconductor device are provided in such a manner that the terminals are divided into a terminal group of the driving power supply wiring for the semiconductor device and a terminal group of a signal wiring of the semiconductor device. Furthermore, the terminal group of the signal wiring of the semiconductor device is connected with the wiring substrate in which a hollow for providing the capacitor device is formed, the capacitor device is provided in the hollow, one terminal of the capacitor device is connected with a terminal group of a driving power supply for the semiconductor device, the other terminal of the capacitor device is connected with a capacitor device-connecting terminal provided in the hollow, and the terminal group of the signal wiring is connected with the wiring substrate in which the wiring is formed.

The present invention has made it possible to embody the high integration and the downsizing of the circuit substrate of a multilayer wiring structure, on which the capacitor devices are provided inside the region on which the large scale integrated circuit semiconductor devices are mounted.

Moreover, in the circuit substrate with which the high frequency band exceeding hundreds of MHz is employed and on which the large-sized large scale integrated circuit semiconductor devices of 10 mm square or more are mounted, it turns out that the wiring distance from a large scale integrated circuit semiconductor device to a connecting terminal of the capacitor device does not exert the strong influence as an inductor component. This situation has made it possible to obtain the noise-absorbing effect based on the connection with the capacitor device.

Also, regarding the high frequency signal from a semiconductor device, the signal wiring is formed in a low dielectric material and the signal is caused to be transmitted through the low dielectric material. This treatment has allowed the signal to be transmitted at high speed.

From the above-described, it has become possible to modify the circuit substrate, on which the semiconductor device-mounting substrates are provided, into a substrate which can be satisfactory as the circuit substrate for high frequency.

BRIEF DESCRIPTION THE DRAWINGS

DESCRIPTION OF THE PREFERRED EMBODIMENTS

The description will be given below concerning embodiments of the present invention.

First Embodiment

Figure 1:
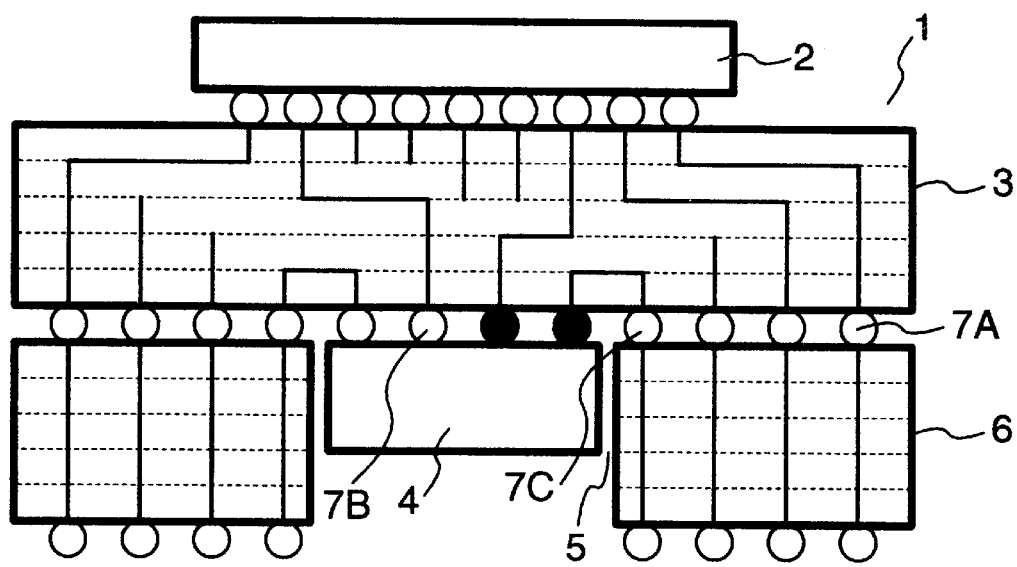
FIG. 1 is a diagram for showing a cross section of a semiconductor device-mounting substrate as an embodiment of the present invention.

FIG. 1 shows, as an embodiment of the present invention, a cross section of a semiconductor device-mounting substrate 1 equipped with a capacitor device.

The semiconductor device-mounting substrate 1 comprises a semiconductor device 2, a wiring substrate 3, and a wiring substrate 6.

The semiconductor device 2 is connected with the wiring substrate 3 having a multilayer structure and composed of a low dielectric material.

Here, the semiconductor device 2 includes a chip such as a LSI chip or an IC chip.

The wiring substrate 3 is connected with a capacitor device 4 and the second wiring substrate 6 which is composed of a low dielectric material and in which a space 5 for providing the capacitor device is formed.

Figure 7:
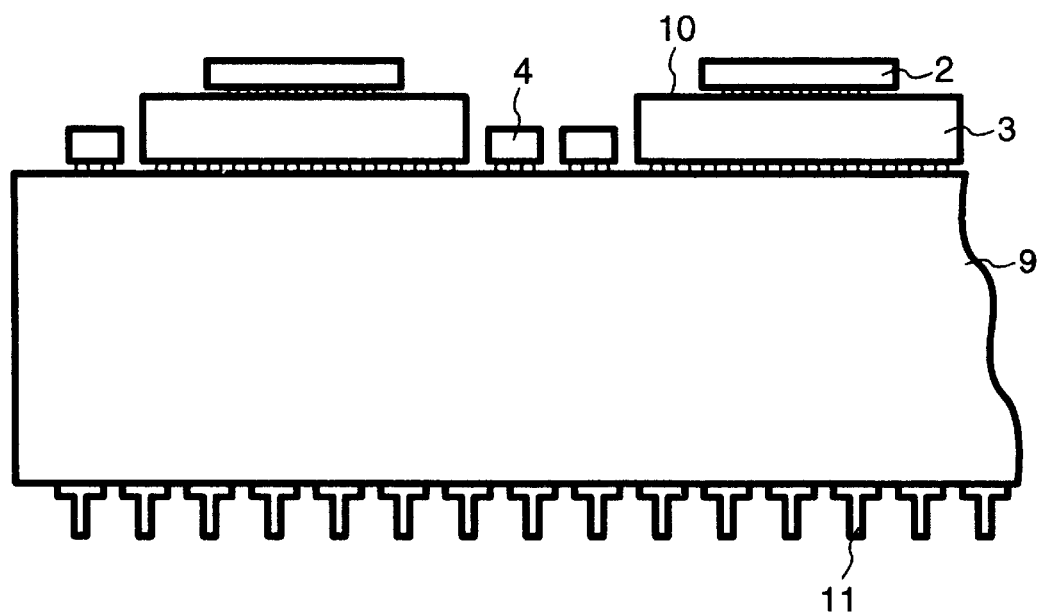
FIG. 7 is a schematic configuration diagram for showing a cross section of a prior art circuit substrate on which semiconductor devices are mounted.
Figure 8:
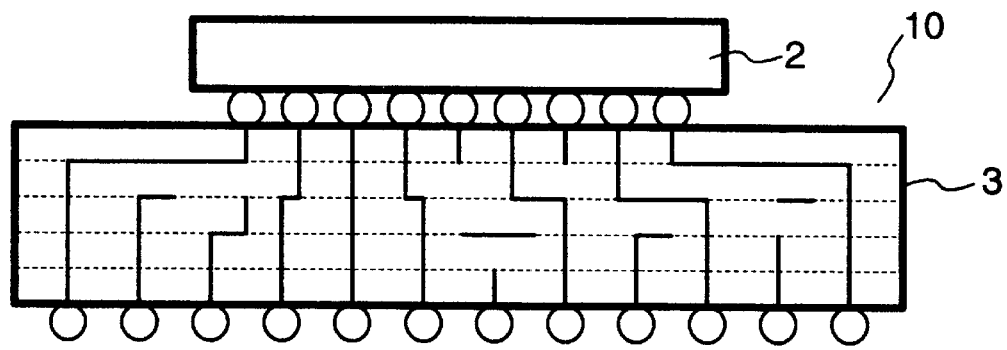
FIG. 8 is a schematic configuration diagram for showing a cross section of a prior art semiconductor device-mounting substrate.

In addition, the semiconductor device-mounting substrate 1, which is equipped with the capacitor device in the space in the second wiring substrate, is further mounted on and connected with a circuit substrate 9 (which, although not illustrated, is equivalent to the above-described circuit substrate 9 in FIG. 7).

Here, a multilayer wiring is formed inside the wiring substrate 3, with which the semiconductor device 2 is connected, so that terminals of the wiring substrate 3 on the side of the second wiring substrate can be divided into a terminal group 7A wired/connected to signal wirings of the semiconductor device within the wiring substrate, a terminal group 7B wired/connected to driving power supply wirings for the semiconductor device within the wiring substrate, and further a terminal group 7C for linking the capacitor device to the second wiring substrate.

The terminal group 7A, which is wired/connected to the signal wirings of the semiconductor device 2, and the terminal group 7C, which links the capacitor device to the circuit substrate, are connected with the second wiring substrate 6. Also, the capacitor device 4 is connected with the terminal group 7B wired/connected to the driving power supply wirings for the semiconductor device.

In the case of FIG. 1, within the second wiring substrate 6, the terminal group 7A and the terminal group 7C are connected with terminals of the second wiring substrate 6 on the side of the circuit substrate 9.

Also, the capacitor device 4 is connected between, for example, terminals which are filled in with black in FIG. 1.

Concerning materials composing the wiring substrate 3 which the semiconductor device is directly mounted on and connected with, there are the following two cases: One case is that a metal with a high melting point, such as tungsten or molybdenum, is employed as the wiring material and the terminal material thereof, and mullite is employed as a low dielectric ceramic material. The other case is that a metal with a low resistance, such as copper, gold, or silver, is employed as the wiring material thereof, and a mixture of a borosilicate glass and a substance such as mullite powder is employed as the low dielectric ceramic material.

The low dielectric ceramic material is formed into a ceramic green sheet in the following way: Employing a method which is publicly-known conventionally as a method of manufacturing a ceramic multilayer wiring substrate, ceramic powder, for example, is made into a slurry substance by being mixed with an organic macromolecule material, a plasticizer and a solvent. Then, the slurry substance, using a forming apparatus, is formed into the ceramic green sheet to be used for formation of the wiring substrate 3.

Also, according to a method which is publicly-known as a method of manufacturing a thick film paste, the metal materials for the wiring material are kneaded and dispersed in a viscous solution obtained by dissolving an organic macromolecule material in a solvent. This treatment makes the metal materials into metal pastes which are suitable for a screen printing and are thus used therefor.

Then, in accordance with requirements for a circuit pattern to be formed, through holes are formed in the ceramic green sheet by means of a punching or a laser. Next, the through holes are filled with a metal paste, and a wiring circuit film or a terminal film is formed on the surface of the green sheet by means of a printing of the metal paste.

The ceramic green sheets, on which the metal film pattern is formed, are multilayered so that terminals are provided on the surface of the uppermost layer and on the reverse surface of the lowermost layer. The ceramic green sheets thus multilayered are then sintered so as to form the wiring substrate 3.

Concerning the wiring substrate 3, terminals for connecting it with the semiconductor device are provided on the surface of the substrate. The following terminals are divided as follows, and are then provided on the reverse surface of the substrate: The terminal group 7A wired/connected to the signal wirings of the semiconductor device, the terminal group 7B which is wired/connected to the driving power supply wirings for the semiconductor device and with which the capacitor device is connected, and further the terminal group 7C for linking one of the terminals of the capacitor device to the second wiring substrate 6.

Furthermore, the second wiring substrate 6, which is formed of a low dielectric material and in which the space 5 for providing the capacitor device is formed, is formed as follows:

As is the case with the wiring substrate 3, a multilayered-ceramic green sheets, on which the metal film pattern is formed, is manufactured. Then, after the space for providing the capacitor device is cut off using a means such as a laser, the multilayered-ceramic green sheets is sintered, or after the multilayered-ceramic green sheets is sintered, the space for providing the capacitor device is cut off using the means such as the laser, thus forming the second wiring substrate 6.

On the surface and the reverse surface of the second wiring substrate 6, terminals wired/connected to the signal wirings of the semiconductor device and terminals wired/connected to the capacitor device on the side of the circuit substrate 9 are formed, respectively.

Also, the thickness of the second wiring substrate 6 is constituted to be greater than a height needed to mount the capacitor device.

Also, in the example shown in FIG. 1, an inside of the second wiring substrate 6 is constituted to have a multilayered connection constitution comprising only metallic pillars (vias) which fill through holes formed in the ceramic green sheets. However, by providing the inner wiring of the wiring substrate 3 and terminals of the circuit substrate 9, it is also possible to allow the above-mentioned inside to have the same multilayered wiring constitution as that of the wiring substrate 3 shown in FIG. 1.

Subsequently, the description will be given below concerning fabrication of the semiconductor device-mounting substrate equipped with the capacitor device shown in the first embodiment.

In the semiconductor device-mounting substrate 1, the semiconductor device 2, the wiring substrate 3, the second wiring substrate 6 and the capacitor device 4 are connected with each other in a three-layered constitution. The semiconductor device-mounting substrate is finally mounted on and connected with the circuit substrate 9.

Then, as is known conventionally, in fabricating such layers, it is important to employ soldering materials the melting point of which are different for each layer.

First, the terminals of the wiring substrate 3 on the side of the second wiring substrate are supplied with solders, the capacitor device is mounted, the second wiring substrate 6 having the space for the capacitor device is mounted, and the solders are heated, thus connecting the wiring substrate 3, the capacitor device 4 and the second wiring substrate 6.

Next, the terminals of the wiring substrate 3 for connecting it with the semiconductor device are supplied with solders, the semiconductor device is mounted, and the solders are heated, thus connecting the semiconductor device 2 onto the surface of the wiring substrate 3.

Moreover, terminals of the circuit substrate 9 (not illustrated) with which the semiconductor device-mounting substrate 1 is connected are supplied with solders, and are heated, thus mounting and connecting the semiconductor device-mounting substrate 1 on and with the circuit substrate 9.

In the circuit thus formed, a driving power supply voltage for the semiconductor device extends from the circuit substrate 9 to the semiconductor device by way of the second wiring substrate 6, the wiring substrate 3 and the capacitor device and further through a wiring path several mm long in the wiring substrate 3.

Also, a high frequency signal occurring from the semiconductor device transmits to the circuit substrate 9 through the wiring substrate 3 and the second wiring substrate 6 which are formed of a low dielectric ceramic material.

This has made it possible to solve the following problems, which appeared in the prior art circuit substrate of a multi-layer wiring structure on which the capacitor devices are provided outside the region on which the large scale integrated circuit semiconductor devices are mounted, thus allowing a noise margin in the circuit operation to be ensured:

A limit to the high integration of the circuit substrate or to the downsizing thereof, moreover, a defect that, in the circuit substrate with which the high frequency band exceeding hundreds of MHz is employed and on which the large-sized large scale integrated circuit semiconductor devices of 10 mm square or more are mounted, the wiring distance from a large scale integrated circuit semiconductor device to a connecting terminal of the capacitor device comes to exert the strong influence as an inductor component, thus resulting in a default that the noise-absorbing effect, which is based on the connection with the capacitor device, can not be obtained, and a problem that, regarding the high frequency signal from a semiconductor device, in order to cause the signal to be transmitted at high speed, it is necessary to form the signal wiring in a low dielectric material and to transmit the signal through the low dielectric material.

Second Embodiment

Figure 2:
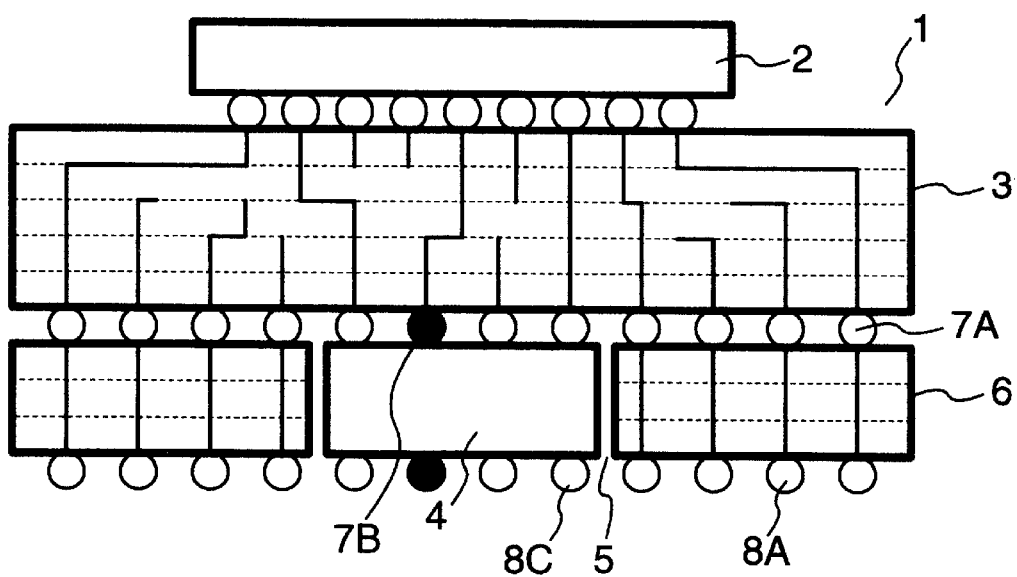
FIG. 2 is a diagram for showing a cross section of a semiconductor device-mounting substrate as a second embodiment of the present invention.

FIG. 2 shows, as another embodiment of the present invention, a cross section of a semiconductor device-mounting substrate 1 equipped with a capacitor device.

A semiconductor device 2 is connected with a wiring substrate 3 having a multilayer structure and formed of a low dielectric material.

The wiring substrate 3 is connected with a capacitor device 4 and a second wiring substrate 6 which is composed of a low dielectric material and in which a space 5 for providing the capacitor device is formed.

In addition, the semiconductor device-mounting substrate 1, which is equipped with the capacitor device 4 in the space 5 in the second wiring substrate 6, is mounted on and connected with a circuit substrate 9 (not illustrated).

Here, a multilayer wiring is formed inside the wiring substrate 3, with which the semiconductor device 2 is connected, so that terminals of the wiring substrate 3 on the side of the second wiring substrate can be divided into a terminal group 7A wired/connected to signal wirings of the semiconductor device within the wiring substrate and a terminal group 7B wired/connected to driving power supply wirings for the semiconductor device within the wiring substrate.

The terminal group 7A of the wiring substrate 3, which is wired/connected to the signal wirings of the semiconductor device, is connected with the second wiring substrate 6. The capacitor device 4 is connected with he terminal group 7B wired/connected to a driving power supply for the semiconductor device.

Also, the other terminal 8C of the capacitor device 4, as is the case with a terminal group 8A of the second wiring substrate 6, is provided on the side of the circuit substrate.

Also, the capacitor device 4 is connected between, for example, terminals which are filled in with black in FIG. 2.

Here, although the wiring substrate 3 and the second wiring substrate 6 are manufactured in much the same way as in the first embodiment, terminals to be formed on the wiring substrate 3 and the second wiring substrate 6 somewhat differ from the terminals in the first embodiment.

Namely, here, the following terminals are divided as follows, and are then provided on the reverse surface of the wiring substrate 3: The terminal group 7A wired/connected to the signal wirings of the semiconductor device and the terminal group 7B wired/connected to the driving power supply wirings for the semiconductor device. Meanwhile, only the terminal group 8A, which is wired/connected to the signal wirings of the semiconductor device, is formed on the second wiring substrate 6.

Also, here, the terminals of the capacitor device are provided on the two surfaces opposed to each other. One of the terminals is connected with the wiring substrate 3, and the other terminal is connected with the circuit substrate 9 (not illustrated).

Also, concerning the second wiring substrate 6, the substrate thickness thereof is set to be equal to the dimension of the capacitor device. This also differs from the first embodiment.

Fabrication of the semiconductor device-mounting substrate in the second embodiment has been performed in much the same way as in the first embodiment.

In the present embodiment, a driving power supply voltage for the semiconductor device extends from the circuit substrate 9 to the semiconductor device directly through the capacitor device and further through a wiring path several mm long in the wiring substrate 3.

Also, a high frequency signal occurring from the semiconductor device transmits to the circuit substrate 9 through the wiring substrate 3 and the second wiring substrate 6 which are composed of a low dielectric ceramic material.

This, as is the case with the first embodiment, has allowed the problems in the prior art to be solved, thus making it possible to ensure a noise margin in the circuit operation.

Third Embodiment

Figure 3:
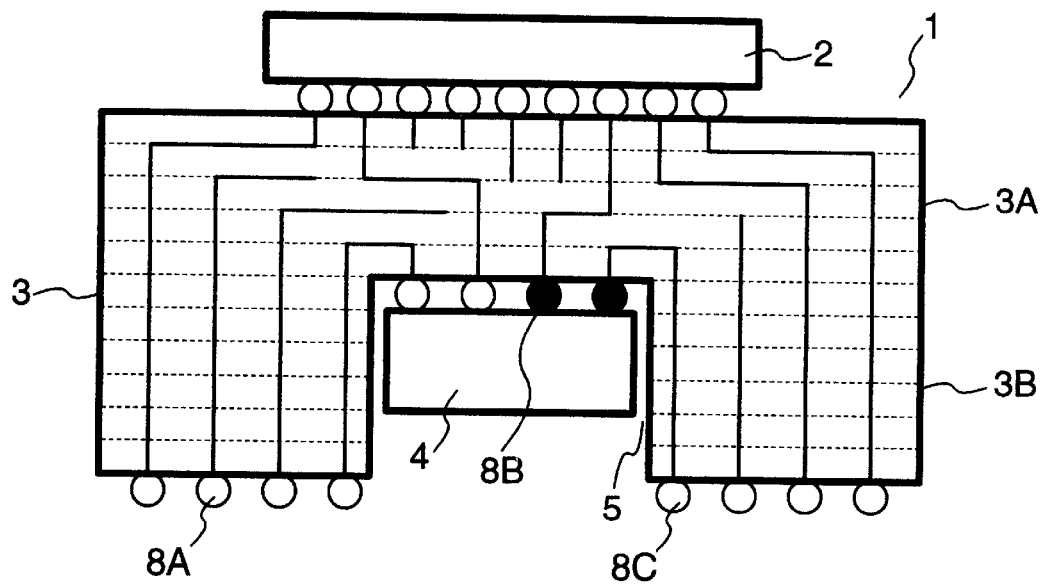
FIG. 3 is a diagram for showing a cross section of a semiconductor device-mounting substrate as a third embodiment of the present invention.

FIG. 3 shows, as another embodiment of the present invention, a cross section of a semiconductor device-mounting substrate 1 equipped with a capacitor device.

A semiconductor device 2 is connected with a wiring substrate 3 having a multilayer structure and composed of a low dielectric material.

A capacitor device 4 and a hollow 5 for providing the capacitor device are formed in the wiring substrate 3.

In addition, the semiconductor device-mounting substrate 1, which is equipped with the capacitor device 4 in the hollow (space) 5 in the wiring substrate, is mounted on and connected with a circuit substrate 9 (not illustrated).

Here, a multilayer wiring is formed inside the wiring substrate 3, with which the semiconductor device is connected, so that terminals of the wiring substrate on the side of the circuit substrate 9 can be divided into a terminal group 8A wired/connected to signal wirings of the semiconductor device within the wiring substrate, a terminal group 8B wired/connected to driving power supply wirings for the semiconductor device within the wiring substrate, and further a terminal group 8C for linking the capacitor device to the circuit substrate 9. The terminal group 8B wired/connected to the driving power supply wirings for the semiconductor device is provided in the hollow 5 in the wiring substrate 3.

The capacitor device 4 is connected with the terminal group 8B wired/connected to a driving power supply for the semiconductor device. The terminal group 8A, which is wired/connected to the signal wirings of the semiconductor device, and the terminal group 8C, which links the capacitor device to the circuit substrate, are connected with the circuit substrate 9 (not illustrated).

The description will be given below concerning formation of the wiring substrate 3 in which the hollow 5 for providing the capacitor device 4 is formed.

Concerning materials composing the wiring substrate, there are the following two cases: One case is that a metal with a high melting point, such as tungsten or molybdenum, is employed as the wiring material and the terminal material thereof, and mullite is employed as a low dielectric ceramic material. The other case is that a metal with a low resistance, such as copper, gold, or silver, is employed as the wiring material thereof, and a mixture of a borosilicate glass and a substance such as mullite powder is employed as the low dielectric ceramic material.

The low dielectric ceramic material is formed into a ceramic green sheet in the following way:
Employing a method which is publicly-known conventionally as a method of manufacturing a ceramic multilayer wiring substrate, ceramic powder is made into a slurry by being mixed with an organic macromolecule material, a plasticizer and a solvent. Then, the slurry, using a forming apparatus, is formed into the ceramic green sheet to be used for the formation of the wiring substrate.

Also, according to a method which is publicly-known as a method of manufacturing a thick film paste, he metal materials for the wiring material are kneaded and dispersed in a viscous solution obtained by dissolving an organic macromolecule material in a solvent. This transaction makes the metal materials into metal pastes which are suitable for a screen printing and are thus used therefor.

Then, in accordance with requirements for a circuit pattern to be formed, through holes are formed in the ceramic green sheet by means of a punching or a laser. Next, the through holes are filled with a metal paste, and a wiring circuit film or a terminal film is formed on the surface of the green sheet by means of a printing of the metal paste.

Concerning a muiltilayer constitution part 3A which ranges from a terminal surface of the wiring substrate 3 for mounting the semiconductor device to the space for providing the capacitor device, the ceramic green sheets on which the metal paste is printed are multilayered and then sintered so as to form the part 3A.

Next, regarding a muiltilayer constitution part 3B having the space for providing the capacitor device, the ceramic green sheets, on which the metal paste is printed and in which the space is cut off, are multilayered and then sintered so as to form the part 3B.

Here, on the upper surface of the space in the wiring substrate 3, the terminal group 8B for connecting the capacitor device with the wiring substrate is provided. Provided on the bottom surface of the wiring substrate 3 are the terminal group 8A wired/connected to the signal wirings of the semiconductor device and the terminal group 8C wired/connected to one of the terminals of the capacitor device.

Subsequently, the description will be given below concerning fabrication of the semiconductor device-mounting substrate equipped with the capacitor device shown in the third embodiment.

First, the capacitor device-mounting space is formed upside down in the wiring substrate 3, the capacitor device-connecting terminal group 8B at the bottom of the space is supplied with solders by means of a dispenser system, or the terminals of the capacitor device are supplied with solders, the capacitor device 4 is mounted onto the space, and the solders are heated, thus connecting the capacitor device 4 with the wiring substrate 3.

Next, semiconductor device-connecting terminals of the wiring substrate 3 are supplied with solders, thus mounting and connecting the semiconductor device on and with the wiring substrate.

Moreover, terminals (not illustrated) of the circuit substrate 9, with which the semiconductor device-mounting substrate 1 is connected, are supplied with solders, and are heated, thus mounting and connecting the semiconductor device-mounting substrate 1 on and with the circuit substrate 9.

In the circuit thus formed, a driving power supply voltage for the semiconductor device extends from the circuit substrate 9 to the semiconductor device by way of the wiring substrate 3 and the capacitor device and further through a wiring several mm long in the wiring substrate 3.

Also, it turns out that a high frequency signal occurring from the semiconductor device transmits to the circuit substrate 9 through the wiring substrate 3 composed of a low dielectric ceramic material.

This, as is the case with the first embodiment, has allowed the problems in the prior art to be solved, thus making it possible to ensure a noise margin in the circuit operation.

Fourth Embodiment

Figure 4:
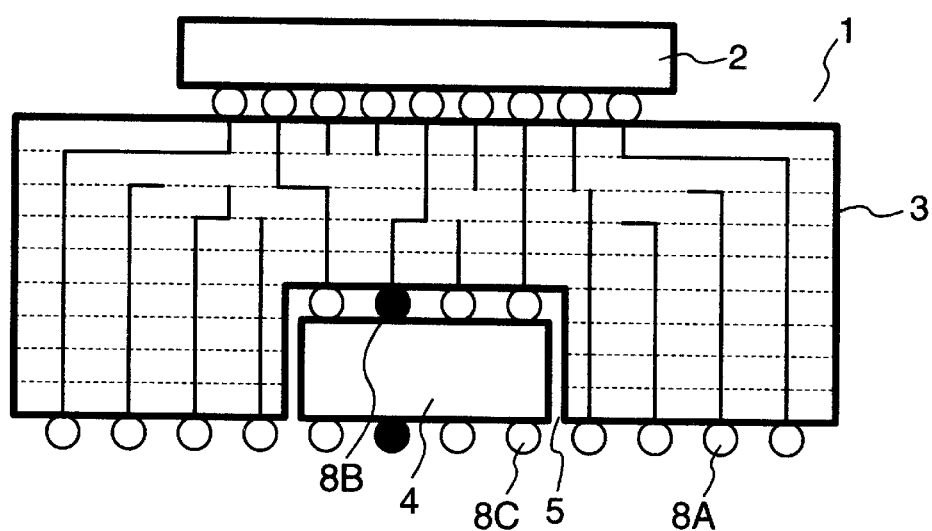
FIG. 4 is a schematic configuration diagram for showing a cross section of a semiconductor device-mounting substrate as a fourth embodiment of the present invention.

FIG. 4 shows, as another embodiment of the present invention, a cross section of a semiconductor device-mounting substrate 1 equipped with a capacitor device.

A semiconductor device 2 is connected with a wiring substrate 3 having a multilayer structure and composed of a low dielectric material. A capacitor device 4 and a hollow 5 for providing the capacitor device are formed in the wiring substrate 3.

In addition, the semiconductor device-mounting substrate 1, which is equipped with the capacitor device 4 in the hollow (space) 5 in the wiring substrate 3, is mounted on and connected with a circuit substrate 9 (not illustrated).

Here, a multilayer wiring is formed inside the wiring substrate 3, with which the semiconductor device is connected, so that terminals of the wiring substrate 3 on the side of the circuit substrate 9 can be divided into a terminal group 8A wired/connected to signal wirings of the semiconductor device within the wiring substrate and a terminal group 8B wired/connected to driving power supply wirings for the semiconductor device within the wiring substrate.

The capacitor device 4 is connected with the terminal group 8B wired/connected to the driving power supply wirings for the semiconductor device. Also, the other terminal 8C of the capacitor device 4, as is the case with the terminal group 8A of the wiring substrate 3, is provided on the side of the circuit substrate.

In the fourth embodiment, the terminals of the capacitor device are provided on the two surfaces opposed to each other. One of the terminals is connected with the wiring substrate 3, and the other terminal is connected with the circuit substrate 9 (not illustrated).

Also, concerning the wiring substrate 3, after the capacitor device is mounted and connected, the depth of the hollow 5 for mounting the capacitor device is made equal to the dimension of bottom surface of the wiring substrate 3. This treatment differs from the third embodiment.

Fabrication of the semiconductor device-mounting substrate in the fourth embodiment has been performed in much the same way as in the third embodiment.

In the present embodiment, a driving power supply voltage for the semiconductor device extends from the circuit substrate 9 to the semiconductor device directly through the capacitor device and further through a wiring path several mm long in the wiring substrate 3.

Also, a high frequency signal occurring from the semiconductor device transmits to the circuit substrate 9 through the wiring substrate 3 composed of a low dielectric ceramic material.

This, as is the case with the first embodiment, has allowed the problems in the prior art to be solved, thus making it possible to ensure a noise margin in the circuit operation.

Fifth Embodiment

Figure 5:
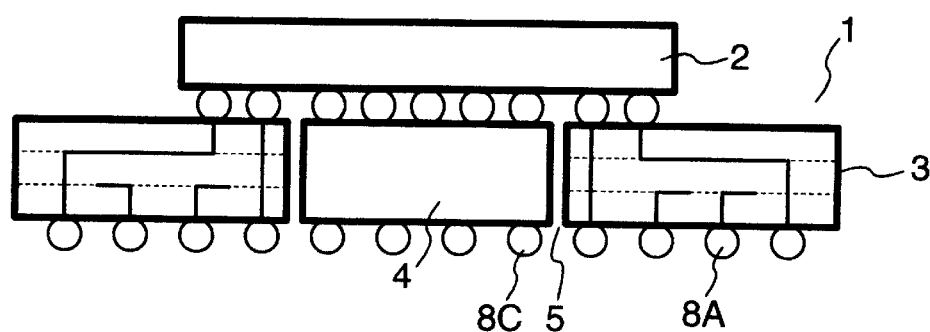
FIG. 5 is a schematic configuration diagram for showing a cross section of a semiconductor device20 mounting substrate as a fifth embodiment of the present invention.

FIG. 5 shows, as another embodiment of the present invention, a cross section of a semiconductor device-mounting substrate 1 equipped with a capacitor device.

Here, terminals of a semiconductor device 2 are located in such a manner that they are divided into a terminal group of driving power supply wirings for the semiconductor device and a terminal group of signal wirings of the semiconductor device.

The semiconductor device is connected with a wiring substrate 3 having a multilayer structure and composed of a low dielectric material. The wiring substrate 3 has a space 5 for providing the capacitor device 4.

In addition, the semiconductor device-mounting substrate 1, which is equipped with the capacitor device 4 in the space 5 in the wiring substrate 3, is further mounted on and connected with a circuit substrate 9 (not illustrated).

Here, inside the wiring substrate 3 connected with the signal wirings of the semiconductor device 2 and composed of a low dielectric material, a signal wiring is formed, and is linked to a terminal group 8A on the side of the circuit substrate.

Also, one terminal 8C of terminals of the capacitor device 4, which is connected with the driving power supply wirings for the semiconductor device, is formed on the side of the circuit substrate.

Concerning the semiconductor device employed in the present embodiment, the terminals thereof are located in such a manner as to be divided into the terminal group of the driving power supply wirings and the terminal group of the signal wirings.

On account of this, the capacitor device is directly connected with a terminal of a driving power supply for the semiconductor device. This differs from the above-described embodiments 1 to 4.

Also, the capacitor device employed in the present embodiment is a capacitor device the terminals of which are provided on the two surfaces opposed to each other.

The wiring substrate 3 employed here has the space for providing the capacitor device, and in addition the wirings and the terminals thereof are produced by forming a copper foil or a copper-plated film onto a low dielectric plastic material.

Subsequently, the description will be given below concerning fabrication of the semiconductor device-mounting substrate 1 in the present embodiment.

A provisional substrate (not illustrated) for the fabrication is employed here.

Provided on the surface of the provisional substrate is a terminal group which is the same as a terminal group provided on the surface of the circuit substrate on which the semiconductor device-mounting substrate 1 is finally mounted.

First, the terminal group on the provisional substrate is supplied with solders, the capacitor device 4 and the wiring substrate 3 are mounted onto predetermined positions, and the solders are heated, thus performing a provisional connection.

Next, terminals on the upper surfaces of the wiring substrate 3 and of the capacitor device 4 are supplied with solders, the semiconductor device is mounted, and the solders are heated, thus connecting the semiconductor device with the capacitor device 4 and the wiring substrate 3.

Still next, a heating is performed again so as to melt and remove the provisional substrate from the capacitor device 4 and the wiring substrate 3, thus fabricating the semiconductor device-mounting substrate 1 equipped with the capacitor device.

In the present embodiment, a driving power supply voltage for the semiconductor device extends from the circuit substrate 9 to the semiconductor device directly through the capacitor device.

Also, a high frequency signal occurring from the semiconductor device transmits to the circuit substrate 9 through the wiring substrate 3 composed of a low dielectric plastic material.

This, as is the case with the first embodiment, has allowed the problems in the prior art to be solved, thus making it possible to ensure a noise margin in the circuit operation.

Incidentally, although plastics are employed here as the low dielectric material of which the wiring substrate 3 is composed, it is also possible to employ low dielectric ceramics as is the case with the other embodiments.

Sixth Embodiment

Figure 6:
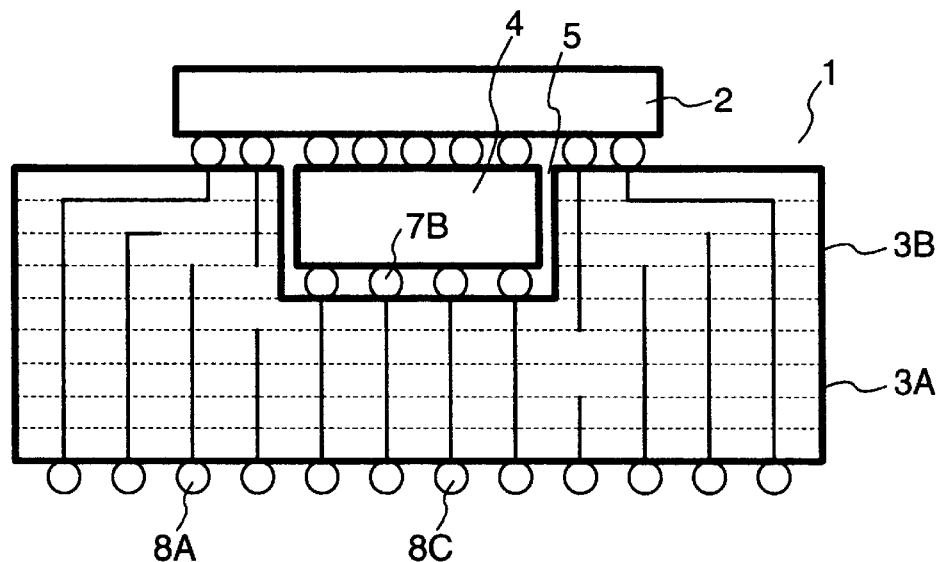
FIG. 6 is a schematic configuration diagram for showing a cross section of a semiconductor device-mounting substrate as a sixth embodiment of the present invention.

FIG. 6 shows, as another embodiment of the present invention, a cross section of a semiconductor device-mounting substrate 1 equipped with a capacitor device.

Here, terminals of a semiconductor device 2 are located in such a manner that they are divided into a terminal group of driving power supply wirings for the semiconductor device and a terminal group of signal wirings of the semiconductor device.

The semiconductor device is connected with a wiring substrate 3 having a multilayer structure and composed of a low dielectric material. The wiring substrate 3 has a hollow (a space) 5 for providing a capacitor device 4.

In addition, the semiconductor device-mounting substrate 1, which is equipped with the capacitor device 4 in the hollow 5 in the wiring substrate 3, is further mounted on and connected with a circuit substrate 9 (not illustrated).

Here, inside the wiring substrate 3 connected with the signal wirings of the semiconductor device 2 and composed of a low dielectric material, a signal wiring is formed, and is linked to a terminal group 8A on the side of the circuit substrate.

Also, one terminal of the capacitor device 4, which is connected with the driving power supply wirings for the semiconductor device, is connected with a terminal formed on the inner surface of the hollow in the wiring substrate 3. The one terminal is further linked to a terminal group 8C on the side of the circuit substrate through an inner wiring of the wiring substrate 3.

The description will be given below concerning formation of the wiring substrate 3 in which the hollow 5 for providing the capacitor device 4 is formed.

Concerning materials composing the wiring substrate, there are the following two cases: One case is that a metal with a high melting point, such as tungsten or molybdenum, is employed as the wiring material and the terminal material thereof, and mullite is employed as a low dielectric ceramic material. The other case is that a metal with a low resistance, such as copper, gold, or silver, is employed as the wiring material thereof, and a mixture of a borosilicate glass and a substance such as mullite powder is employed as the low dielectric ceramic material.

The low dielectric ceramic material is formed into a ceramic green sheet in the following way:

Employing a method which is publicly-known conventionally as a method of manufacturing a ceramic multilayer wiring substrate, ceramic powder is made into a slurry by being mixed with an organic macromolecule material, a plasticizer and a solvent. Then, the slurry, using a forming apparatus, is formed into the ceramic green sheet to be used for the formation of the wiring substrate.

Also, according to a method which is publicly-known as a method of manufacturing a thick film paste, the metal materials for the wiring material are kneaded and dispersed in a viscous solution obtained by dissolving an organic macromolecule material in a solvent. This treatment makes the metal materials into metal pastes which are suitable for a screen printing and are thus used therefor.

Then, in accordance with requirements for a circuit pattern to be formed, through holes are formed in the ceramic green sheet by means of a punching or a laser. Next, the through holes are filled with a metal paste, and a wiring circuit film or a terminal film is formed on the surface of the green sheet by means of a printing of the metal paste.

Concerning a muiltilayer constitution part 3A which ranges from a terminal surface of the wiring substrate 3 on the side of the circuit substrate 9 (not illustrated) to the bottom surface of the hollow 5 for providing the capacitor device 4, the ceramic green sheets on which the metal paste is printed are multilayered and then sintered so as to form the part 3A.

Next, regarding a muiltilayer constitution part 3B having the hollow 5 for providing the capacitor device 4, the ceramic green sheets, on which the metal paste is printed and in which a space for the hollow is cut off, are multilayered and then sintered so as to form the part 3B.

Here, on the bottom surface of the hollow 5 in the wiring substrate 3, a terminal group 7B for connecting the capacitor device with the wiring substrate is provided. Provided on the bottom surface of the wiring substrate 3 are the terminal group 8A wired/connected to the signal wirings of the semiconductor device and the terminal group 8C wired/connected to the one terminal of the capacitor device.

Subsequently, the description will be given below concerning fabrication of the semiconductor device-mounting substrate 1 equipped with the capacitor device shown in the sixth embodiment.

First, the capacitor device-mounting hollow 5 is formed upside down in the wiring substrate 3, the capacitor device-connecting terminal group 7B at the bottom of the hollow 5 is supplied with solders by means of a dispenser system, or the terminals of the capacitor device are supplied with solders, the capacitor device 4 is mounted onto the hollow 5, and the solders are heated, thus connecting the capacitor device 4 with the wiring substrate 3.

Next, semiconductor device-connecting terminals of the wiring substrate 3 and the terminals of the capacitor device 4 are supplied with solders, thus mounting and connecting the semiconductor device.

Moreover, terminals (not illustrated) of the circuit substrate 9, with which the semiconductor device-mounting substrate 1 is connected, are supplied with solders, and are heated, thus mounting and connecting the semiconductor device-mounting substrate 1 on and with the circuit substrate 9.

In the circuit thus formed, a driving power supply voltage for the semiconductor device extends from the circuit substrate 9 directly to the semiconductor device by way of the wiring substrate 3 and the capacitor device.

Also, it turns out that a high frequency signal occurring from the semiconductor device transmits to the circuit substrate 9 through the wiring substrate 3 composed of a low dielectric ceramic material.

This, as is the case with the first embodiment, has allowed the problems in the prior art to be solved, thus making it possible to ensure a noise margin in the circuit operation.

Seventh Embodiment

Figure 9:
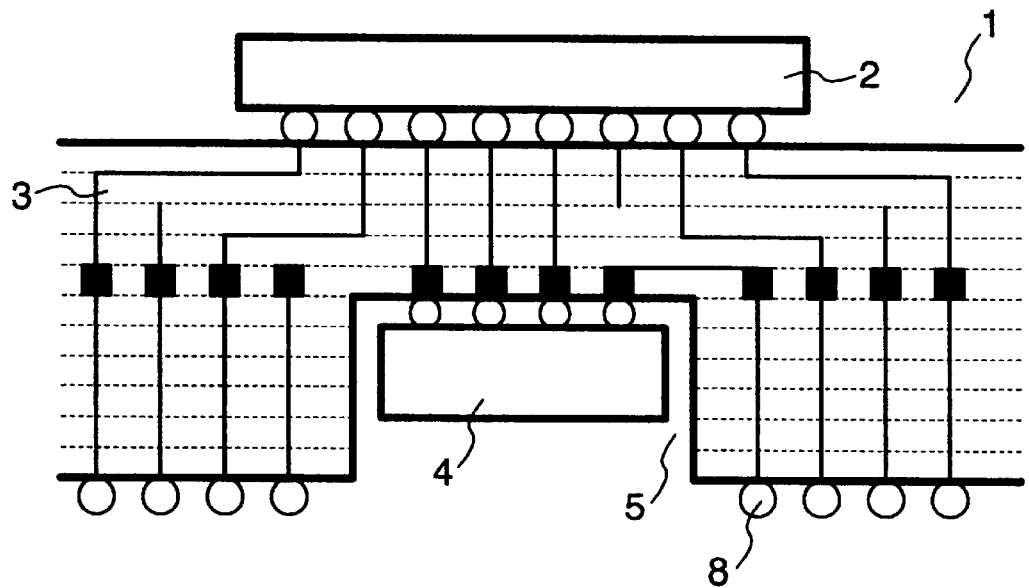
FIG. 9 is a diagram for showing a cross section of a semiconductor device-mounting substrate as a seventh embodiment of the present invention.

FIG. 9 shows a cross sectional view of a seventh embodiment of the present invention. The seventh embodiment is an embodiment related with the third embodiment or the fourth one.

Concerning formation of the hollow in which the capacitor device is mounted, the following two methods can be considered: One is a method in which a space is bored in advance in a corresponding portion in a ceramic green sheet and then the ceramic green sheets thus processed are multilayered and sintered. The other is a method in which, after ceramic green sheets are multilayered and sintered, a space is formed with a laser or by a machining. When employing the former method, by using a method such as a printing, it is possible to form in advance a terminal at a position on a ceramic green sheet at which the capacitor device is connected with the terminal. Meanwhile, when employing the latter method, it turns out that an terminal with which the capacitor device is connected is a via itself. However, with the development in high integration of the semiconductor devices and an increase in the number of pins thereof, it becomes necessary to miniaturize diameter of vias in the semiconductor device-mounting substrate. This makes it necessary to precisely perform operations such as a position alignment at the time of mounting the capacitor device, thus bringing about a problem about the easiness with which the capacitor device is mounted. Also, it is possible to upsize the terminal by making a control so that, through an enlargement of diameter of a pad connecting the vias with each other, depth of the spot facing is formed up to the pad. However, it is required to consider factors such as variations in the dimension of the semiconductor device-mounting substrates and an exact control of the depth of the space (hollow) formation. This results in an increase in the cost.

Then, in order to solve these problems, a layer corresponding to a bottom surface of the formed space is constituted so that it has no wirings and comprises only the vias. This constitution allows the diameter of the vias to be enlarged, thus making it possible to mount the capacitor device easily and to take an allowable width for the depth of the formed space in an extensive range.

Incidentally, in FIG. 9, reference numeral 12 designates a veer (of a wide diameter).

What is claimed is:

1. A semiconductor device mounting substrate comprising:
   a semiconductor device having a terminal for driving power supply wiring and a terminal for signal wiring;
   a capacitor device, and
   a wiring substrate of multilayer wiring, said wiring substrate having wirings made of conductive metal formed in layers made of low dielectric constant material, having one surface mounting said semiconductor device thereon through said terminals of said semiconductor device and having the other surface formed with a hollow of a depth which is larger than a thickness of said capacitor device, said capacitor device being disposed within the hollow, said wiring substrate electrically connecting the terminal for driving power supply of said semiconductor device to said capacitor device through a wiring within said wiring substrate, wherein
   said wiring substrate is provided with terminals disposed on said one surface and the other surface and within said hollow;
   said terminals disposed on the other surface include a terminal connected to said terminal disposed within said hollow and connected electrically to said capacitor device and a terminal connected to said terminal for signal wiring of said semiconductor device, through wirings formed within said wiring substrate; and said wirings formed within said wiring substrate include a wiring connecting said terminal disposed on said one surface directly to said terminal disposed on the other surface, a wiring connecting said terminal disposed on said one surface directly to said wiring disposed within said hollow, and a wiring connecting said wiring disposed within said hollow directly to said wiring disposed on the other surface.

2. A semiconductor device mounting substrate according to claim 1, wherein a via diameter of a wiring exposed to or near to a bottom surface of said hollow is made larger than a via diameter of said wiring disposed within said wiring substrate and away from said bottom to form said terminal disposed within said hollow.

* * * * *